United States Patent
Nakaya

(10) Patent No.: US 12,027,438 B2
(45) Date of Patent: Jul. 2, 2024

(54) SEMICONDUCTOR DEVICE

(71) Applicant: Mitsubishi Electric Corporation, Tokyo (JP)

(72) Inventor: Daisuke Nakaya, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 448 days.

(21) Appl. No.: 17/415,557

(22) PCT Filed: Mar. 20, 2019

(86) PCT No.: PCT/JP2019/011794
§ 371 (c)(1),
(2) Date: Jun. 17, 2021

(87) PCT Pub. No.: WO2020/188806
PCT Pub. Date: Sep. 24, 2020

(65) Prior Publication Data
US 2022/0059428 A1 Feb. 24, 2022

(51) Int. Cl.
*H01L 23/02* (2006.01)
*H01L 23/00* (2006.01)
(Continued)

(52) U.S. Cl.
CPC ...... *H01L 23/3675* (2013.01); *H01L 23/3732* (2013.01); *H01L 23/3736* (2013.01);
(Continued)

(58) Field of Classification Search
CPC ............. H01L 23/3675; H01L 23/3732; H01L 23/3736; H01L 24/48; H01L 25/072;
(Continued)

(56) References Cited

U.S. PATENT DOCUMENTS 5,108,955 A   4/1992   Ishida et al.
5,179,039 A   1/1993   Ishida et al.
(Continued)

FOREIGN PATENT DOCUMENTS

CN    107026107 A    8/2017
JP    H01-282845 A   11/1989
(Continued)

OTHER PUBLICATIONS

International Search Report issued in PCT/JP2019/011794; dated May 28, 2019.
(Continued)

*Primary Examiner* — Niki H Nguyen
(74) *Attorney, Agent, or Firm* — Studebaker & Brackett PC

(57) ABSTRACT

A semiconductor device including a board having a ground electrode and resin layers and a semiconductor chip mounted on the board, includes: a core embedded inside the board such that a front surface thereof is exposed on the front surface side of the board; a filled via provided so as to penetrate the resin layer disposed between the core and the ground electrode, of the resin layers, and electrically connecting a back surface of the core and the ground electrode; a joining material including a lid provided on the board so as to cover the semiconductor chip, having an exposed front surface, and having a high thermal conductivity and sintered silver joining a back surface of the lid and the front surface of the core; and a mold resin transfer-molded on an entirety of the front surface of the board and provided so as to surround the lid.

13 Claims, 13 Drawing Sheets

(51) Int. Cl.
*H01L 23/367* (2006.01)
*H01L 23/373* (2006.01)
*H01L 23/498* (2006.01)
*H01L 25/07* (2006.01)
*H01L 23/552* (2006.01)

(52) U.S. Cl.
CPC ........ *H01L 23/49838* (2013.01); *H01L 24/48* (2013.01); *H01L 25/072* (2013.01); *H01L 23/552* (2013.01); *H01L 2224/48225* (2013.01)

(58) Field of Classification Search
CPC ......... H01L 23/552; H01L 2224/48225; H01L 2224/73204; H01L 2924/1531; H01L 2224/16225; H01L 2924/00014; H01L 23/49816; H01L 2224/73265; H01L 2225/1058; H01L 2224/0401; H01L 24/32; H01L 2224/32145; H01L 2924/01079; H01L 23/3128; H01L 2924/18161; H01L 23/49827; H01L 2224/45099; H01L 2924/01047; H01L 21/6835; H01L 24/92; H01L 25/0652; H01L 21/56; H01L 23/49838; H01L 2224/131; H01L 2924/01074; H01L 2924/3511; H01L 2224/13147; H01L 25/16; H01L 23/3121; H01L 2924/01033; H01L 2225/06572; H01L 2924/10253; H01L 25/18; H01L 2924/15153; H01L 2924/15787; H01L 2224/81424; H01L 2924/19043; H01L 24/29; H01L 2224/13113; H01L 2224/18; H01L 2224/81801; H01L 2924/15192; H01L 2224/05624; H01L 2224/1132; H01L 2224/81; H01L 2225/1041; H01L 2924/01046; H01L 2224/11464; H01L 2224/83102; H01L 24/19; H01L 21/568; H01L 2224/03464; H01L 2224/05144; H01L 2224/05611; H01L 2224/11901; H01L 23/3135; G01L 23/49838
See application file for complete search history.

(56) References Cited

U.S. PATENT DOCUMENTS

| | | | |
|---|---|---|---|
| 5,233,225 A | 8/1993 | Ishida et al. | |
| 5,289,039 A | 2/1994 | Ishida et al. | |
| 2009/0215230 A1 | 8/2009 | Muto et al. | |
| 2010/0041181 A1* | 2/2010 | Huang | .................... H01L 21/50 |
| | | | 257/E21.599 |

FOREIGN PATENT DOCUMENTS

| | | | |
|---|---|---|---|
| JP | H03-062955 A | | 3/1991 |
| JP | H03-096064 U | | 10/1991 |
| JP | H05-109945 A | | 4/1993 |
| JP | H05-251598 A | | 9/1993 |
| JP | 2000-188359 A | | 7/2000 |
| JP | 2005-101365 A | | 4/2005 |
| JP | 2006319008 | * | 11/2006 |
| JP | 2009-200338 A | | 9/2009 |
| JP | 2010-219554 A | | 9/2010 |
| JP | 2013-183069 A | | 9/2013 |
| JP | 2014-036033 A | | 2/2014 |
| JP | 2017-139278 A | | 8/2017 |
| JP | 2017139278 | * | 8/2017 |
| JP | 2018-121005 A | | 8/2018 |

OTHER PUBLICATIONS

An Office Action; "Notice of Reasons for Refusal", mailed by the Japanese Patent Office dated Mar. 15, 2022, which corresponds to Japanese Patent Application No. 2021-506103 and is related to U.S. Appl. No. 17/415,557; with English language translation.

An Office Action mailed by China National Intellectual Property Administration on Mar. 6, 2024, which corresponds to Chinese Patent Application No. 201980092563.9 and is related to U.S. Appl. No. 17/415,557; with English language translation.

* cited by examiner

SEMICONDUCTOR DEVICE

TECHNICAL FIELD

The present disclosure relates to a semiconductor device.

BACKGROUND ART

In conventional mold sealing technology, it is common to seal an upper portion of a semiconductor chip only with a mold resin, thereby ensuring electrical insulation of the semiconductor chip and preventing damage to the semiconductor chip due to physical impact from the outside of a semiconductor device. On the other hand, since the mold resin has a characteristic of extremely low thermal conductivity, the heat self-generated by the semiconductor chip is hardly dissipated from the mold resin and is generally dissipated from a ground electrode surface formed on the back surface of a multilayer printed board or the like on which the semiconductor device is mounted (see, for example, Patent Documents 1 and 2 below).

CITATION LIST

Patent Document

Patent Document 1: Japanese Laid-Open Patent Publication No. 3-062955

Patent Document 2: Japanese Laid-Open Patent Publication No. 2013-183069

SUMMARY OF THE INVENTION

Problems to Be Solved By the Invention

Since the conventional semiconductor device is configured as described above, there are the following problems. First, when the semiconductor chip is driven for a long time at a temperature higher than about 200° C., the mold resin becomes seized on the semiconductor chip and the semiconductor chip fails. Moreover, in recent years, as represented by GaN on SiC (semiconductor device made of gallium nitride crystal-grown on a silicon carbide substrate), self-generation of heat by the semiconductor chip is increased as the output and the power density of the semiconductor chip are increased, and heat dissipation from the ground electrode surface through a filled via of the multilayer printed board is insufficient, so that it is difficult to achieve high frequency characteristics or target performance with long-term reliability. In addition, a parasitic capacitance is generated by the mold resin entering between electrodes of the semiconductor chip, resulting in deterioration of the high frequency characteristics. Moreover, the mold resin cannot prevent entry of moisture from the outside air. Thus, when moisture reaches the semiconductor chip, the moisture resistance of the semiconductor device is deteriorated. Furthermore, when a plurality of semiconductor chips are driven at the same time, the high frequency characteristics are deteriorated due to interference between leakage electromagnetic fields of the semiconductor chips.

The present disclosure has been made to solve the above problems, and an object of the present disclosure is to provide a semiconductor device that realizes the following.

(1) A mold resin does not become seized on a semiconductor chip even when the semiconductor chip is driven.

(2) The thermal resistance of the entire semiconductor device can be reduced, so that it is easy to achieve high frequency characteristics or target performance with long-term reliability.

Solution to the Problems

A semiconductor device according to the present disclosure includes:

a board;

a semiconductor chip disposed on a front surface of the board;

a lid joined to the front surface of the board and covering the semiconductor chip, and a mold resin formed on an entirety of the front surface of the board and provided so as to surround the lid such that a front surface of the lid is exposed, wherein a height of a front surface of the mold resin is lower than a height of the front surface of the lid in a thickness direction of the board.

Effect of the Invention

The semiconductor device according to the present disclosure achieves an effect that the mold resin does not become seized on the semiconductor chip even when the semiconductor chip is driven, and the thermal resistance of the entire semiconductor device can be reduced, so that it is easy to achieve high frequency characteristics or target performance with long-term reliability.

DESCRIPTION OF EMBODIMENTS

Embodiment 1

Hereinafter, a semiconductor device according to Embodiment 1 will be described.

Figure 1:
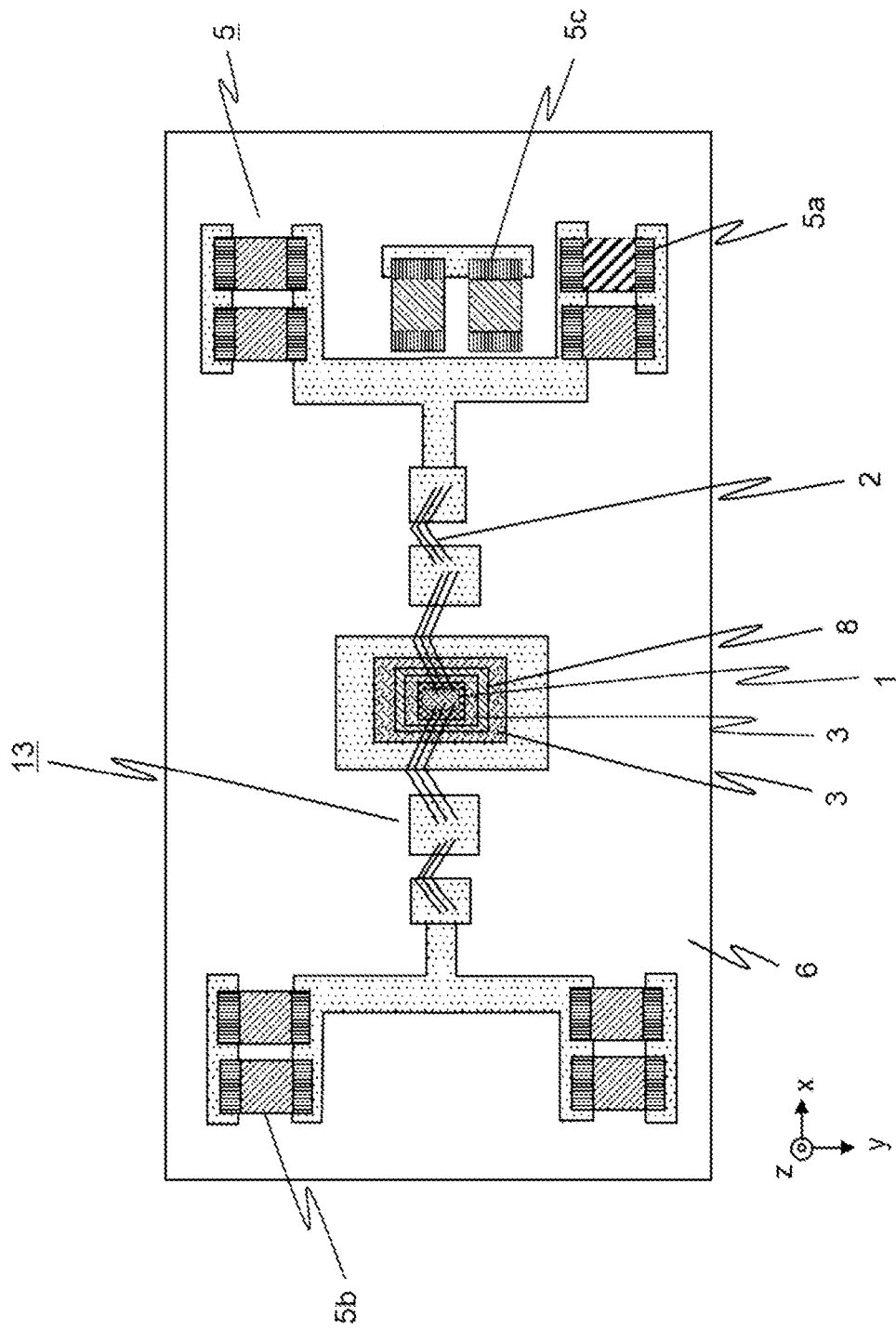
FIG. 1 is a plan view showing the overall structure of a semiconductor device according to Embodiment 1.
Figure 2:
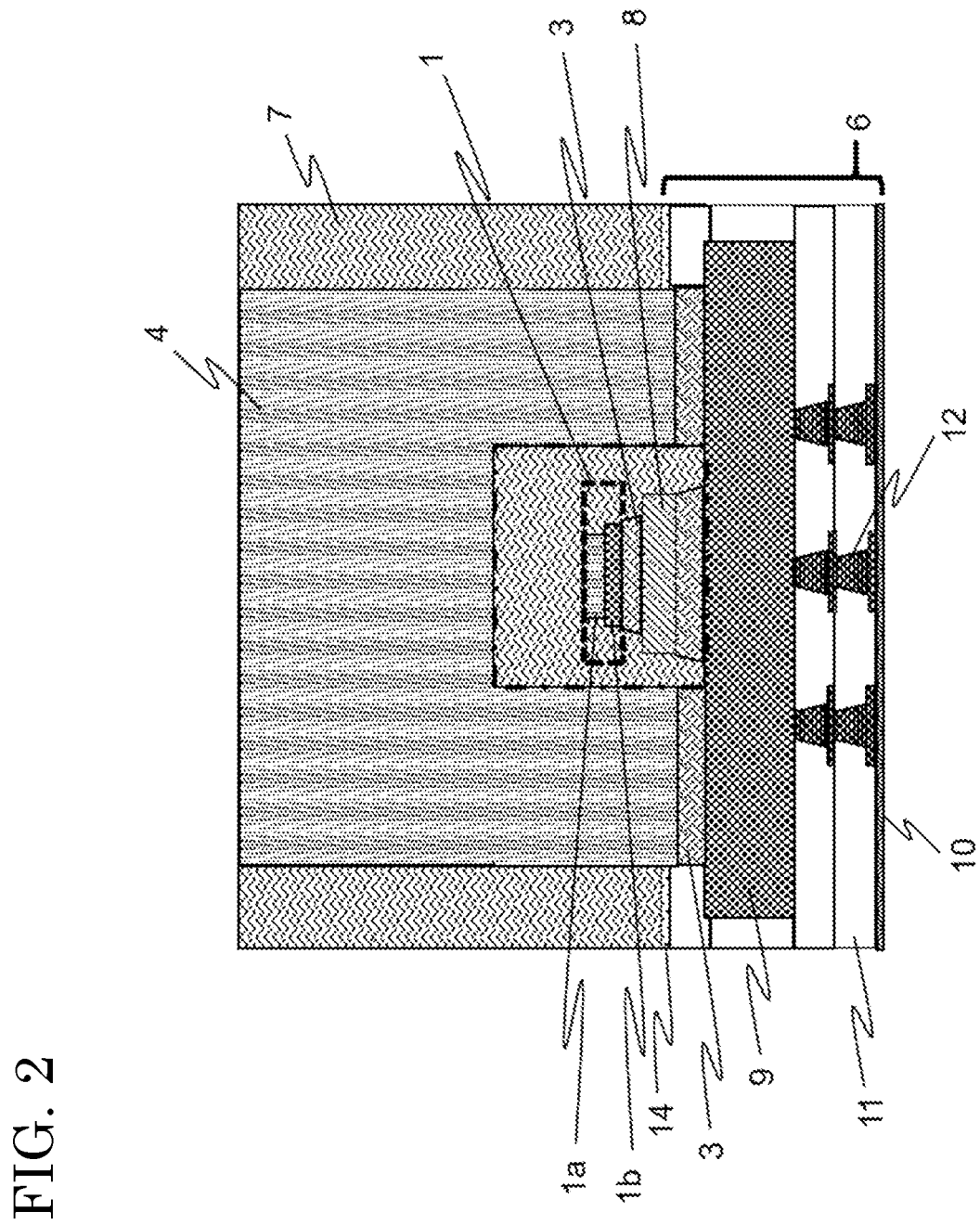
FIG. 2 is a partially enlarged cross-sectional view of the semiconductor device according to Embodiment 1.
Figure 3:
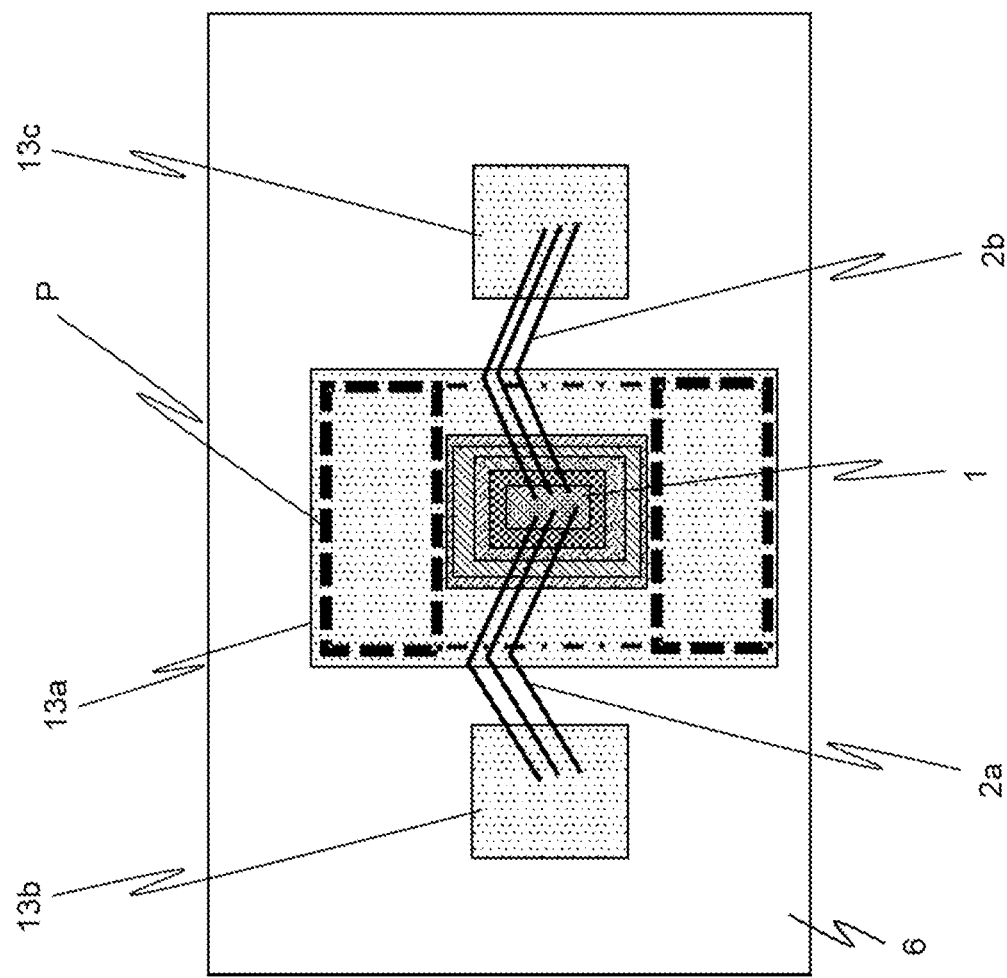
FIG. 3 is a partially enlarged plan view of the semiconductor device according to Embodiment 1.

FIG. 1 is a plan view showing the whole picture of the semiconductor device (note that a Cu lid and a mold resin are not shown), FIG. 2 is a cross-sectional view in the vertical direction of FIG. 1 showing a semiconductor chip and the vicinity thereof in the semiconductor device of FIG. 1 in an enlarged manner, and FIG. 3 is a plan view showing the semiconductor chip and the vicinity thereof in the semiconductor device of FIG. 1 in an enlarged manner (note that the Cu lid and the mold resin are not shown). Hereinafter, the horizontal direction of FIG. 1 is referred to as an x direction, the vertical direction is referred to as a y direction, and the direction perpendicular to an xy plane (the thickness direction of a printed board) is referred to as a z direction.

In FIG. 1 and FIG. 2, the semiconductor device according to Embodiment 1 is assumed as a semiconductor device including a semiconductor chip 1 (having a configuration of GaN on SiC as shown in FIG. 2 in the present embodiment), Au wires 2, sintered silver 3 (also referred to as Ag paste 3; the same applies hereinafter), a Cu lid 4, SMD components 5 (SMD is an abbreviation for Surface Mount Device; the same applies hereinafter), a printed board 6, a mold resin 7, and a ceramic sub-mount 8 in a structure thereof. Among these components, the sintered silver 3 is provided so as to sandwich the sub-mount 8 as shown in FIG. 2. In addition, the mold resin 7 is formed so as to surround the Cu lid 4.

In FIG. 2, the printed board 6 includes, in the order from the lower side in the drawing, a ground electrode surface 10, resin layers 11 composed of multiple layers, filled vias 12 that electrically connect the ground electrode surface 10 and a Cu core 9, a peripheral pattern 13, etc. In this drawing, the filled vias 12 are provided so as to penetrate the two layers of the resin layers 11 on the side closer to the ground electrode surface 10. More specifically, the peripheral pattern 13 corresponds to a first-layer Cu wiring pattern 14 (hereinafter, also referred to as an L1 layer 14).

FIG. 3 is a plan view around the semiconductor chip related to the semiconductor device, and is a view showing a part of FIG. 1 in an enlarged manner in order to supplement FIG. 1. In this drawing, the semiconductor chip 1 is connected to a peripheral pattern 13b by input wires 2a and connected to a peripheral pattern 13c by output wires 2b. In addition, in the peripheral pattern 13a, frames P surrounded by broken lines in an upper portion and a lower portion indicate a contact region via the sintered silver 3, which is a joining material between the Cu lid 4 and the Cu core 9. A location shown by two alternate long and short dash lines at two locations indicates a position where an open hole is formed.

Here, the Cu lid has a tunnel structure with an open hole (see a portion shown by frame lines as the alternate long and short dash lines in the drawing) spatially opened as shown in FIG. 2 in order to avoid contact with the input wires 2a and the output wires 2b, that is, in order to route the wires in a non-contact manner, and a cross-sectional shape of the Cu lid is a C shape. The cross-sectional shape is not limited to the C shape as long as a structure that avoids contact between the semiconductor chip and the Au wires is employed, and the cross-sectional shape may be a U shape or the like. The shape of the Cu lid is formed such that the contact area of the printed board with the Cu core 9 is maximized and the distance from the semiconductor chip is minimized at the same time, and the Cu lid is mounted on the printed board.

Figure 4:
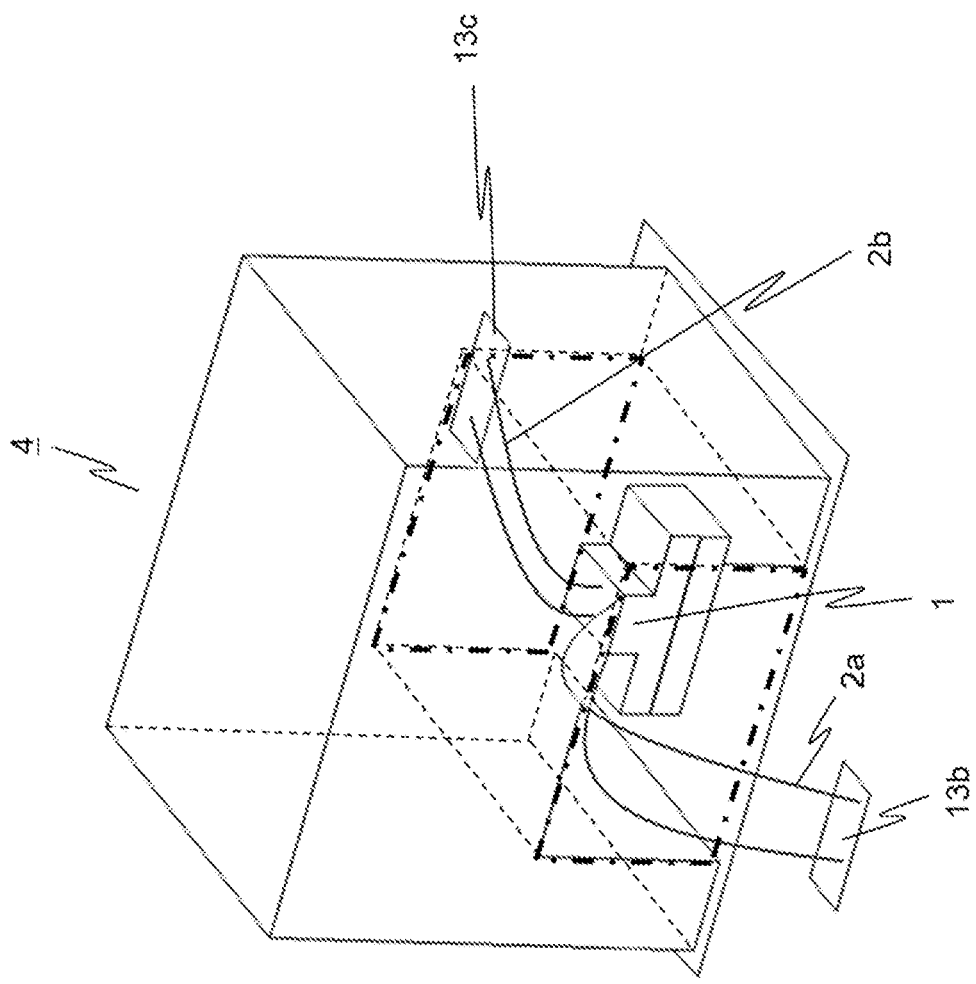
FIG. 4 is a three-dimensional image view of FIG. 3.

FIG. 4 illustrates the arrangement state of the Cu lid and the Au wires in the above description by an image view using a perspective view in order to three-dimensionally show the arrangement state. From this drawing, it is seen that, due to the tunnel structure provided to the Cu lid 4 (in this drawing, two parallelograms shown by alternate long and short dash lines indicate the position of the open hole), the input wires 2a and the output wires 2b, which are connected to the semiconductor chip 1 and the peripheral pattern 13a and to the semiconductor chip 1 and the peripheral pattern 13b, respectively, are not in contact with the Cu lid 4.

In Embodiment 1, the heat self-generated by the semiconductor chip initially diffuses toward the Cu core 9. Thereafter, most of the heat is transferred through the filled vias 12 to the ground electrode surface 10 side due to the difference in thermal conductivity between the resin layers 11 (whose material is FR4 or the like. Here, FR4 is an abbreviation for Flame Retardant Type 4) and the filled vias 12 (for example, FR4 has a thermal conductivity of about 0.3 W/m*K, Cu has a thermal conductivity of 400 W/m*K) of the printed board. It is assumed that there are about 50 filled vias 12 having a size with a diameter of $1.0 \times 10^{-4}$ m and a height of $1.4 \times 10^{-4}$ m. Here, W indicates watt, m indicates meter, and K indicates Kelvin temperature (the same applies hereinafter).

Meanwhile, on the Cu lid side, the heat is transferred to the top surface side of the Cu lid via the sintered silver for fixing the Cu lid.

As described above, by fixing the ground electrode surface 10 and the top surface side of the Cu lid to a housing of a final product with solder, heat conductive paste, or the like, heat dissipation paths of the semiconductor device can be ensured in two upward and downward directions, respectively.

Here, by selecting a high heat dissipation type (for example, a thermal conductivity of about 150 W/m*K) as the sintered silver, the thermal resistance from the semiconductor chip to the Cu lid can be about half the thermal resistance (about 1 K/W) from the semiconductor chip to the ground electrode surface.

When this is converted to a specific Cu lid size, since the thermal resistance of a metal material is proportional to the electrical resistance of the metal material, and the proportionality constant of the metal material is defined by the product of volume resistivity and thermal conductivity, the values are approximately as follows. As for the size of the Cu core related to the thermal resistance from the semiconductor chip to the ground electrode surface, the area thereof is about $7 \times 10^{-6}$ $m^2$ and the thickness thereof is about $2.5 \times 10^{-4}$ m when viewed in a cross-section shown in FIG. 6. As for the size of the Cu lid, both leg portions have an area of about $7 \times 10^{-6}$ $m^2$ and a thickness of about $2.5 \times 10^{-4}$ m, and a roof portion (described later) has an area of about $7 \times 10^{-6}$ $m^2$ and a thickness of about $6 \times 10^{-4}$ m.

In FIG. 2 and FIG. 3 of Patent Document 1, a structure in which a heat dissipation plate is provided on the back surface of a semiconductor chip and exposed on the back surface of a package is proposed. In this heat dissipation plate, a metal lid is joined to the side surface of the heat dissipation plate, so that Patent Document 1 is essentially different from the present embodiment in that the heat dissipation path from the semiconductor chip to the outside inevitably becomes longer. Therefore, it is considered that the structure proposed in Patent Document 1 hardly contributes to heat dissipation of the semiconductor device.

In the present embodiment, since the heat dissipation path can be provided directly above the semiconductor chip, the thermal resistance of the product can be significantly reduced compared to the conventional technology in which heat is dissipated only from the ground electrode surface of the printed board.

Figure 10:
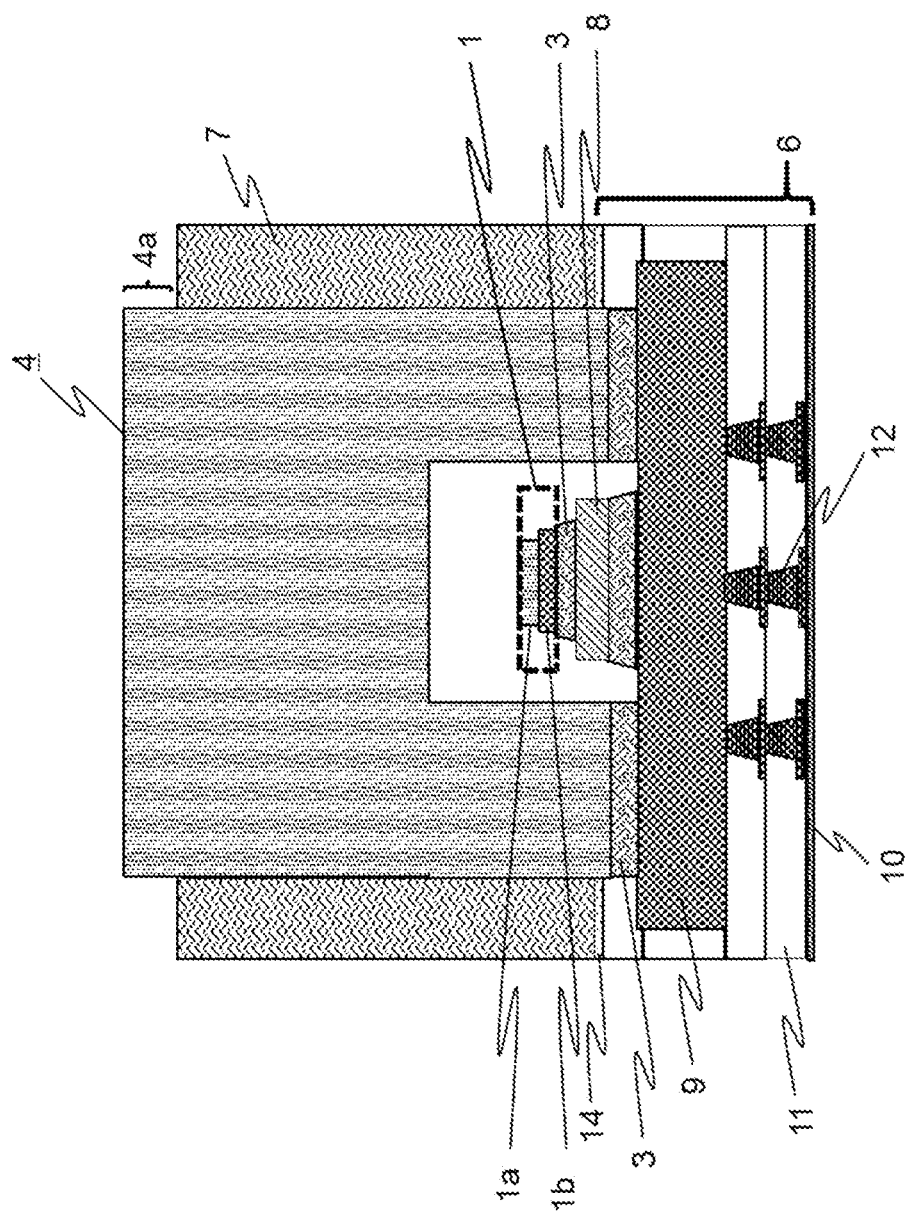
FIG. 10 is a cross-sectional view around a semiconductor chip related to a semiconductor device according to Embodiment 3.

Moreover, in FIG. 10 of Patent Document 2, a structure including a semiconductor chip that is mounted in an element mounting region on a circuit board, a metal lid that covers the semiconductor chip, and a sealing body that covers only the side surface of the metal lid, is proposed. The structure proposed in FIG. 10 is different from the present embodiment in that the metal lid is not mounted in an element mounting region for the metal lid.

Therefore, in the structure disclosed in Patent Document 2, since the metal lid and the semiconductor chip can be regarded as being considerably separated from each other, it is unlikely that the metal lid effectively functions to dissipate the heat self-generated by the semiconductor chip.

In the present embodiment, by mounting the semiconductor chip and the metal lid directly on the Cu core, the heat self-generated by the semiconductor chip can be transferred via the Cu core, so that a heat dissipation path can be provided directly above the semiconductor chip. Thus, the thermal resistance of the product can be significantly reduced compared to the conventional technology in which heat is dissipated only from the ground electrode surface of the printed board.

That is, in a semiconductor device having a structure in which a semiconductor chip is sealed with a mold resin in order to prevent deterioration of the operating characteristics or reliability of the semiconductor device due to the heat self-generated by the semiconductor device, it is made possible to prevent the deterioration of the operating characteristics or reliability by the physical properties of the mold resin.

Hereinafter, a method for producing this structure will be described.

(1) After sintered silver is applied to a printed board having a Cu core, a semiconductor chip, a sub-mount, and a Cu lid are set, and heating is performed up to the thermosetting temperature of the sintered silver (about 200° C.) to thermoset the sintered silver. The melting point of the thermoset sintered silver is several hundreds of degrees Celsius.

(2) Wire-bonding of Au wires is performed.

(3) The SMD components 5 such as chip inductors 5a, chip resistors 5b, and chip capacitors 5c are mounted with solder.

(4) A mold resin is transfer-molded on the entire front surface of the printed board.

(5) The mold top surface is ground with a grinding device to expose the top surface of the Cu lid.

The description has been given above on the assumption that the joining material is high-performance sintered silver normally having a thermal conductivity of about 150 W/m*K. However, if the thermal conductivity is 30 W/m*K or higher, the thermal resistance from the semiconductor chip to the Cu lid side can be reduced to be lower than the thermal resistance from the semiconductor chip to the Cu core side. In addition, the description has been given above on the assumption that the Cu core is used, but the present disclosure is not limited thereto, and as an alternative core to the Cu core, it is possible to use a core that is made of a substance having heat dissipation performance equal to or higher than that of the Cu core and can be joined with the sintered silver. Furthermore, the description has been given on the assumption that the wires are Au wires, but the present disclosure is not limited thereto, and the same effects are achieved even with Cu wires.

In the above, the board included in the semiconductor device of the present embodiment has been described using the "printed board" which is a typical name, but the present disclosure is not limited thereto, and the board may be referred to as an electronic circuit board (a ceramic board is also included therein) which is a general name. Hereinafter, these boards are collectively referred to as a board.

In the above, the semiconductor chip may be directly attached to the board without the Cu core. In addition, the Cu core does not have to be embedded in the board and may be on the front surface of the board. Moreover, the sintered silver is used for joining, but solder or an adhesive may be used as long as the heat dissipation condition of the device can be satisfied. Furthermore, it is assumed that the filled vias are responsible for heat dissipation between the Cu core and the ground electrode, but the filled vias do not have to be provided.

Embodiment 2

Figure 5:
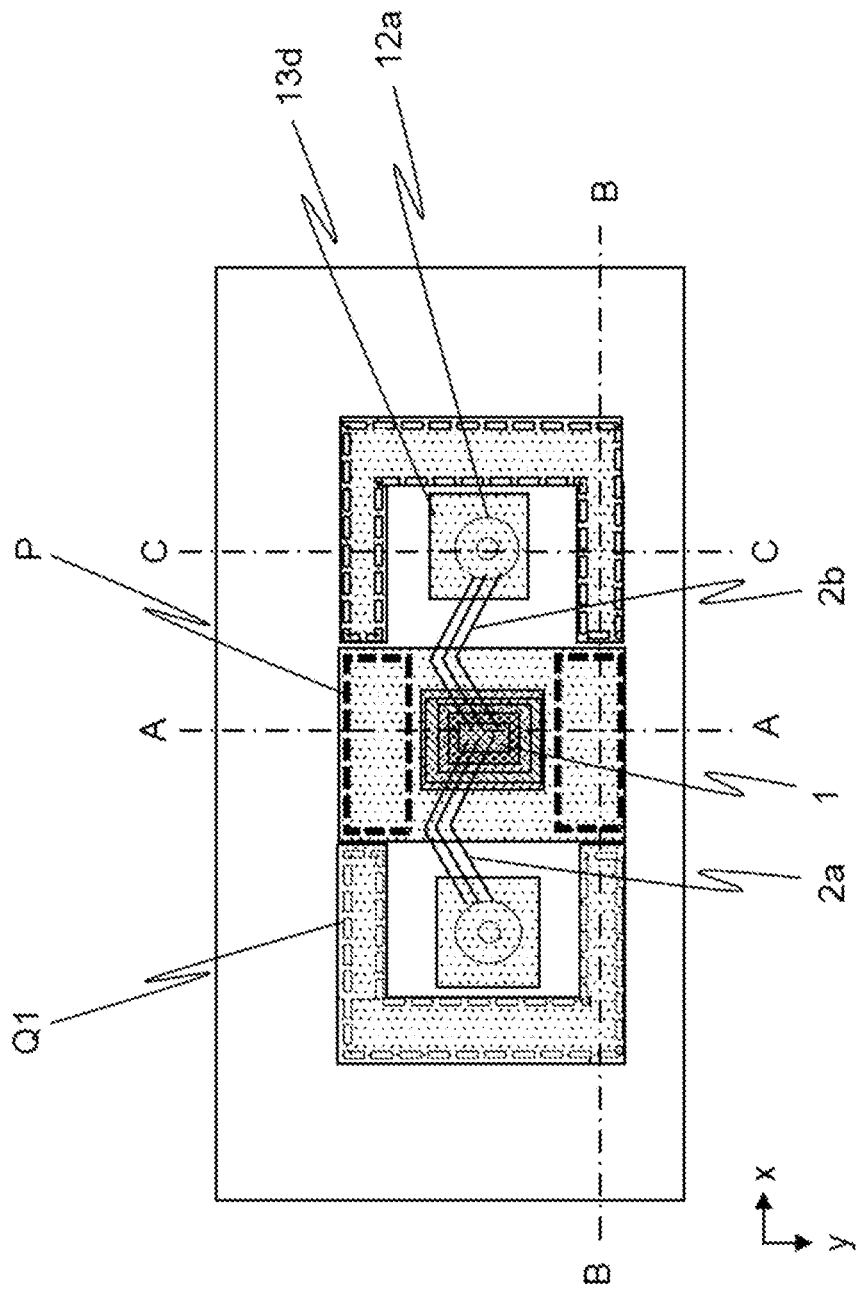
FIG. 5 is a plan view around a semiconductor chip related to a semiconductor device according to Embodiment 2.

In Embodiment 1 described above, the shape of the Cu lid is shown as a shape having a tunnel structure in order to avoid contact with the input wires and the output wires. However, a wall that blocks the entrance and exit of the tunnel structure (a wall that blocks the inside of the frame line as the alternate long and short dash line which is the opened portion shown in FIG. 2 and FIG. 4, or the portion between the alternate long and short dash lines at the two locations which is the opened portion shown in FIG. 3) may be provided as shown in FIG. 5. In this case, upper filled vias 12a that are via holes are provided directly below relay patterns 13d which relay to take out the input wires and the output wires to the outside. The reason why the upper filled vias 12a are provided directly below the relay patterns 13d as described above is to shorten the electrical distance between the input and output of the semiconductor chip and to eliminate the need for adding a wire and the like.

In FIG. 5, the semiconductor chip 1 is connected to the left and right relay patterns 13d by the input wires 2a and the output wires 2b, respectively. The upper filled via 12a connected to a signal electrode is provided directly below each relay pattern. Furthermore, upper and lower two frames P surrounded by broken lines shown in a peripheral pattern disposed in a center portion represent contact regions, between the Cu core and the Cu lid, which contribute to heat dissipation. Moreover, frames Q1 surrounded by white broken lines shown in peripheral patterns disposed on the left and right sides of the peripheral pattern disposed in the center portion represent contact regions, between the L1 layer and the Cu lid, which do not contribute to heat dissipation.

Figure 6:
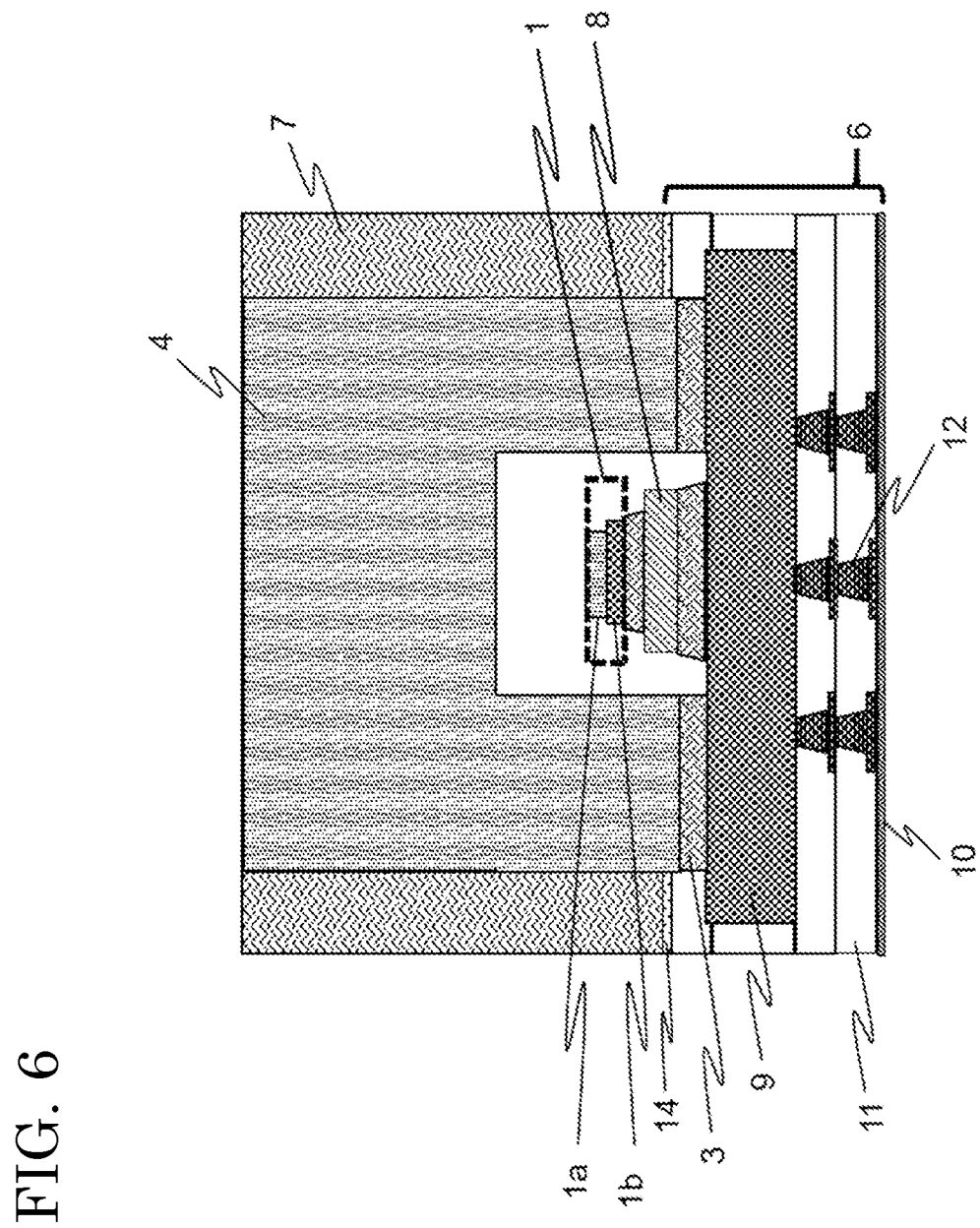
FIG. 6 is a first cross-sectional view around the semiconductor chip related to the semiconductor device according to Embodiment 2.
Figure 7:
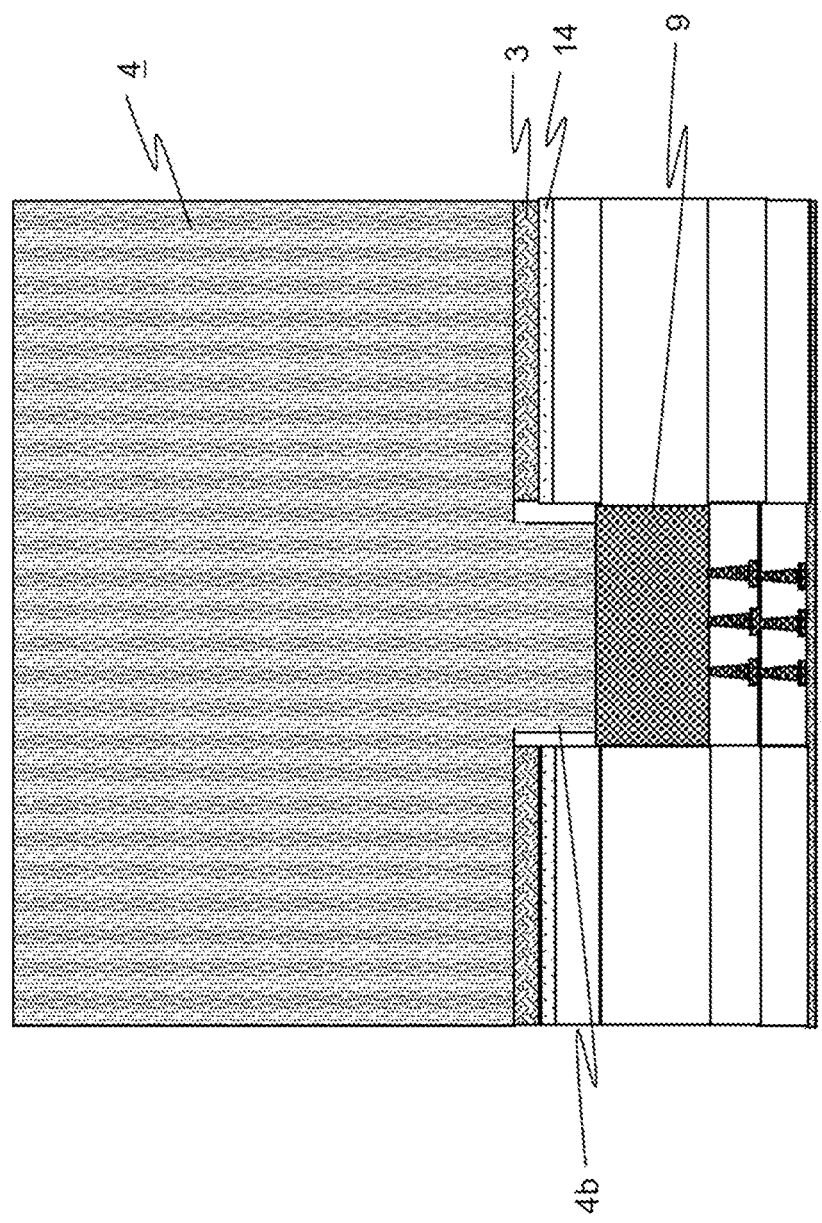
FIG. 7 is a second cross-sectional view around the semiconductor chip related to the semiconductor device according to Embodiment 2.

FIG. 6 and FIG. 7 are views in which the cross-sectional shape in FIG. 5 is shown in two directions, respectively. FIG. 6 is a cross-sectional view (see a cross-section AA) in the y direction of FIG. 5 showing the semiconductor chip and the vicinity thereof in the semiconductor device of FIG. 5 in an enlarged manner, and FIG. 7 is a cross-sectional view (see a cross-section BB) in the x direction of FIG. 5 showing the semiconductor chip and the vicinity thereof in the semiconductor device of FIG. 5 in an enlarged manner. In addition, FIG. 8 shows a cross-sectional view in a cross-section CC which is a cross-section in the y direction of FIG. 5 and different from that of FIG. 6, in order to illustrate the details of the upper filled via 12a shown in FIG. 5.

In FIG. 7, an L1 layer 14 is provided so as to be in contact with the lower surface of the sintered silver 3. A Cu lid is formed such that a portion thereof projects to a height position that is lower than the position in the height direction of the L1 layer 14. This projecting portion is a Cu lid projection 4b and is a contact portion that is in contact with the Cu core 9.

Figure 8:
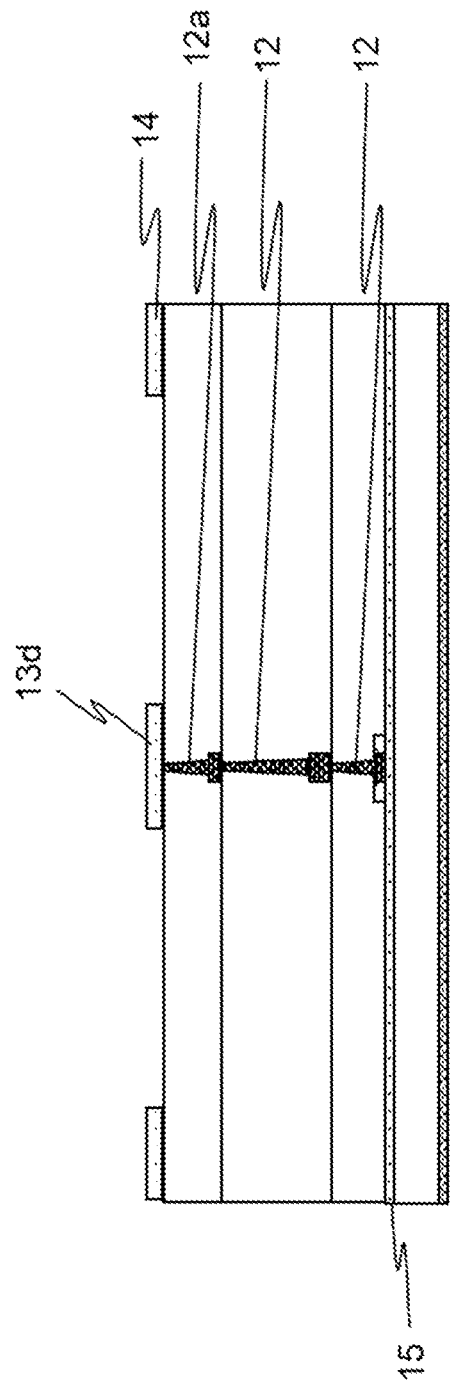
FIG. 8 is a third cross-sectional view around the semiconductor chip related to the semiconductor device according to Embodiment 2.

As shown in FIG. 8, the upper filled via 12a, which is a via hole, is provided directly below the relay pattern 13d which relays to take out the input wires and the output wires to the outside. This upper filled via 12a is connected to a fourth-layer Cu wiring pattern 15 via two filled vias 12 provided below the upper filled via 12a. With such a configuration, it is possible to shorten the electrical distance between the input and output of the semiconductor chip without additionally providing a wire or the like.

Figure 9:
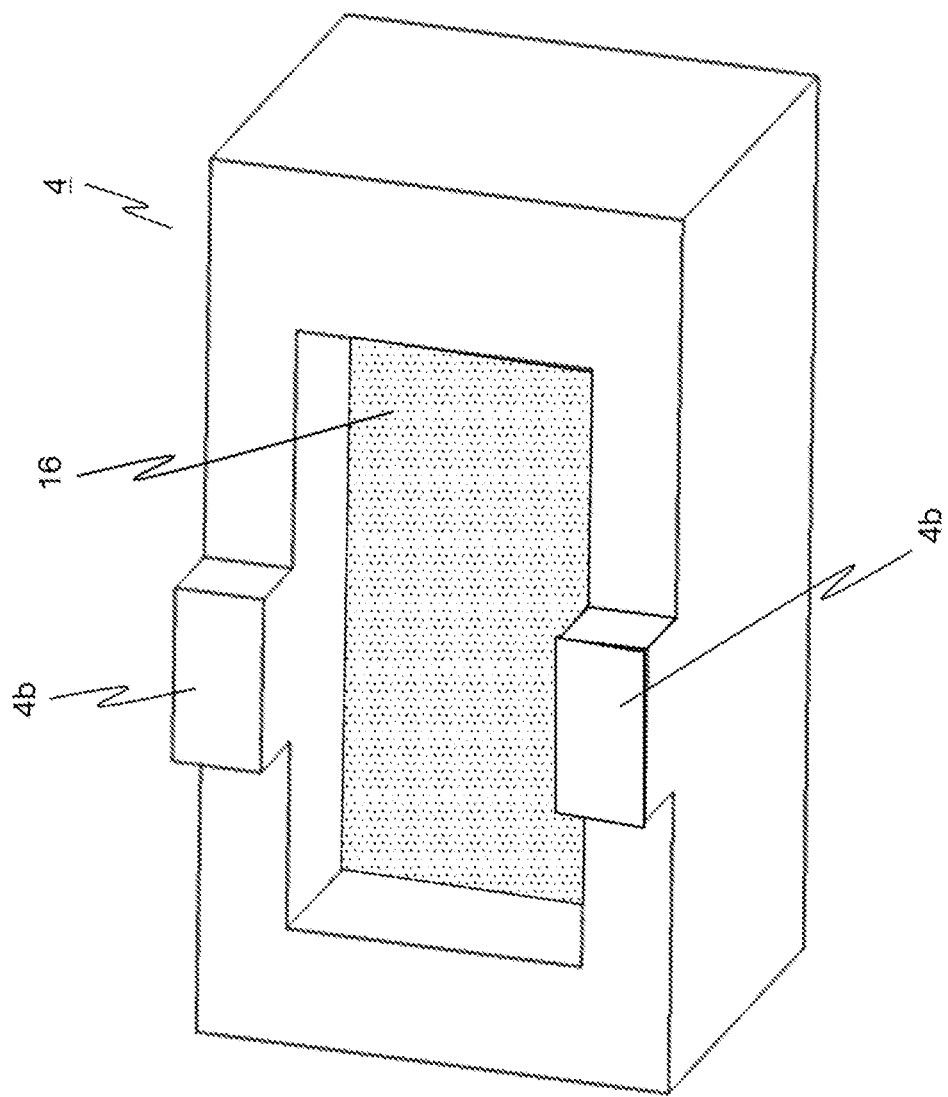
FIG. 9 is a three-dimensional image view of FIG. 7.

FIG. 9 is a perspective view as an image when only the Cu lid is three-dimensionally represented in order to three-dimensionally illustrate the structure of the Cu lid shown in FIG. 7. As shown in FIG. 9, the Cu lid projection 4b described with reference to FIG. 7 is formed at two locations. In FIG. 9, a rectangular portion provided with a pattern corresponds to a roof portion 16.

In Embodiment 1, the tunnel structure of the Cu lid is opened in order to avoid interference with the input wires or the output wires. However, in Embodiment 2, a wall is provided at the entrance and exit of the tunnel structure of the Cu lid and joined to the pattern of the L1 layer of the printed board, thereby providing a structure in which the semiconductor chip and the Au wires are hermetically sealed.

Accordingly, in addition to the effects of Embodiment 1, the following effects are obtained.

(1) By preventing the mold resin from being seized on the semiconductor chip during high-temperature operation of the semiconductor chip, it is made possible to raise the temperature of an active layer when the semiconductor chip can operate without failure.

(2) Since the mold resin does not enter a gap of an electrode structure such as the source and the gate of the semiconductor chip, a parasitic capacitance is not generated, so that deterioration of the high frequency characteristics can be prevented.

(3) By sealing the semiconductor chip with the Cu lid and the Cu core and preventing moisture from entering the chip from the mold resin, the moisture resistance of the product is improved.

(4) The cross-sectional area of the roof portion of the Cu lid is increased, and in addition to the contents of the above item (1), the thermal resistance on the mold top surface side can be reduced.

(5) Electromagnetic field leakage from the semiconductor chip can be prevented.

Embodiment 3

In Embodiment 2, the heights of the top surface of the mold resin and the top surface of the Cu lid are caused to coincide with each other when the ground electrode surface is used as a reference for height. However, a structure, in which a Cu lid upper portion is exposed by making the height of the mold lower than the height of the Cu lid during molding of the mold resin, may be employed.

FIG. 10 is a diagram for illustrating the Cu lid exposed portion and is a cross-sectional view corresponding to FIG. 6 of Embodiment 2. As shown in this drawing, in the present embodiment, a portion of the Cu lid projects from the upper surface of the mold resin 7. This projecting portion is a Cu lid exposed portion 4a.

In this case, since the Cu lid is allowed to be exposed from the upper surface of the mold resin 7, a step of grinding the Cu lid top surface with a grinding device can be omitted, so that the processing cost can be reduced.

Embodiment 4

In Embodiment 2, the number of semiconductor chips is one. In the case where a plurality of semiconductor chips are mounted, the Cu lid may have a plurality of tunnel structures. For example, when the number of semiconductor chips is two, the Cu lid can have two tunnel structures.

Figure 11:
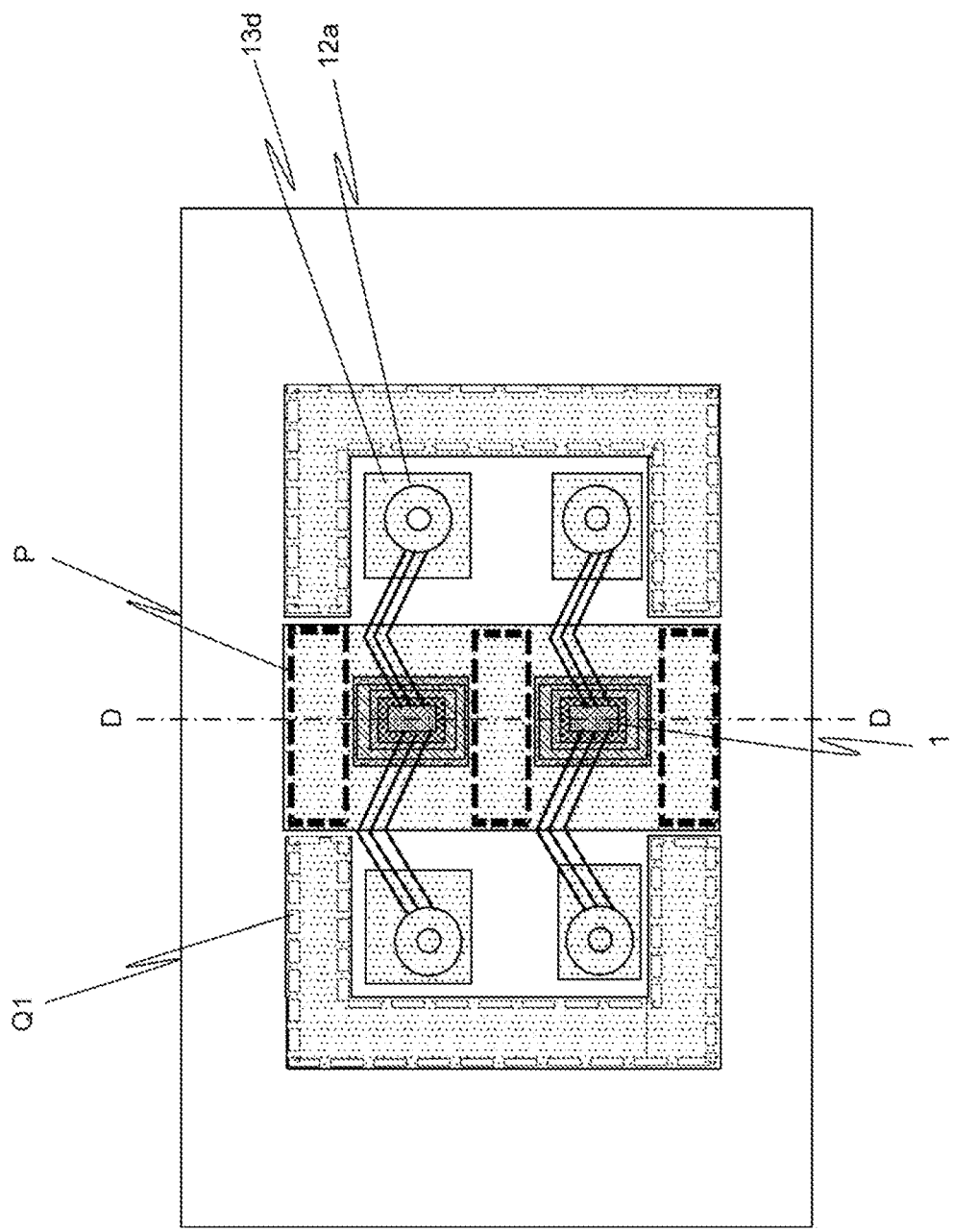
FIG. 11 is a plan view around a semiconductor chip related to a semiconductor device according to Embodiment 4.
Figure 12:
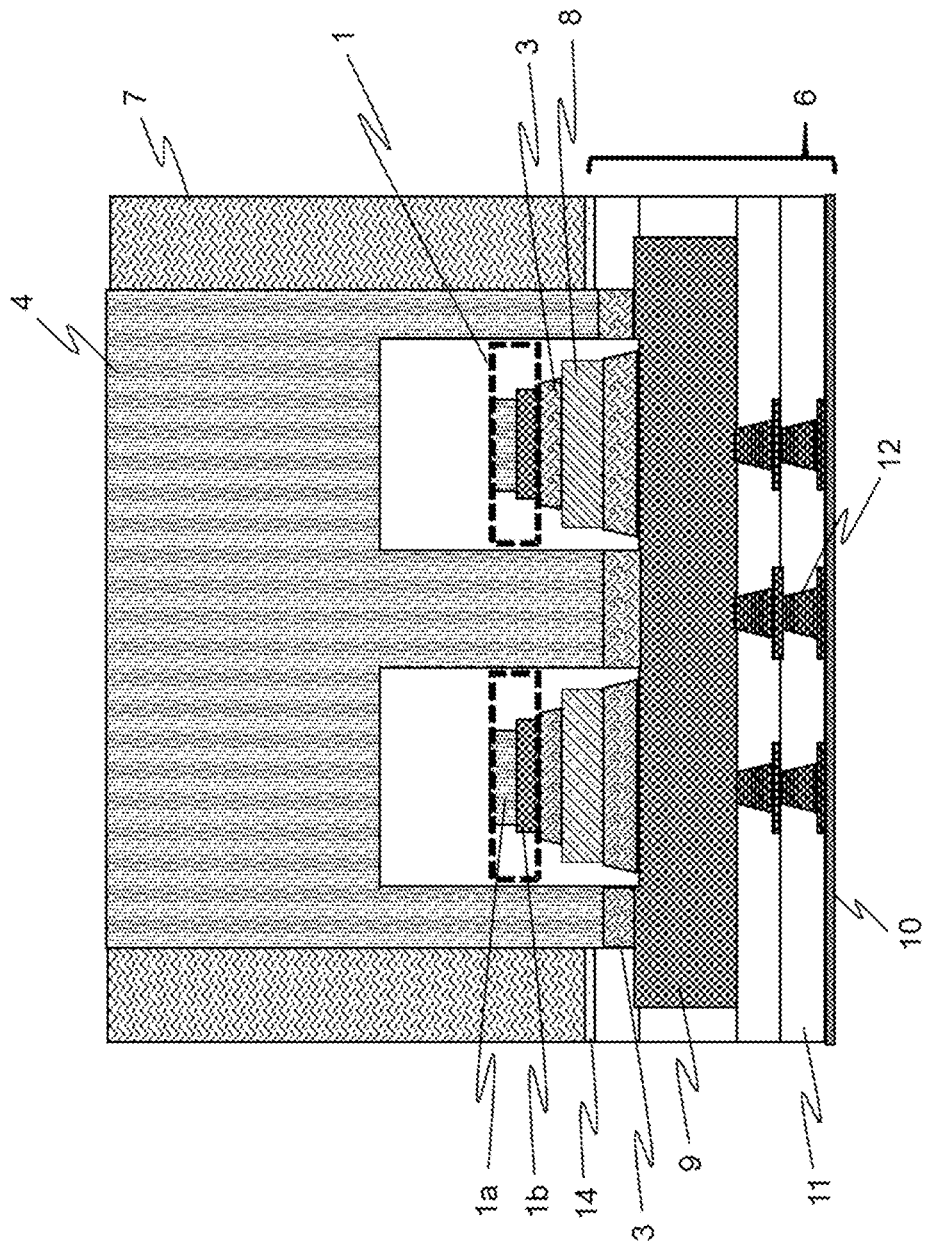
FIG. 12 is a cross-sectional view around the semiconductor chip related to the semiconductor device according to Embodiment 4.

FIG. 11 shows an example of a semiconductor device in the case of having two tunnel structures, in a plan view. FIG. 12 is a cross-sectional view in a cross-section DD of FIG. 11. It can be seen that two tunnel structures are provided so as to correspond to the number of semiconductor chips.

In FIG. 11, one relay pattern 13d is provided on each of the input side and the output side so as to correspond to each of the two semiconductor chips 1. An upper filled via 12a connected to a signal electrode is disposed at a position corresponding to the inside of each relay pattern 13d when viewed from the upper surface, such that an extra wire for connecting electrodes is not required. In addition, a contact region between the Cu lid and the Cu core (three locations in total) is indicated by a frame P surrounded by a broken line, and a contact region between the Cu lid and the L1 layer (left and right two locations) is indicated by a frame Q1 surrounded by a white broken line. Also, here, similar to the frame Q1 in Embodiment 2, the frame Q1 has a C-shape.

As shown in FIG. 12, in the present embodiment, unlike Embodiment 2 described above, one tunnel structure is provided on each of the left and right sides so as to correspond to each of the two semiconductor chips 1. Moreover, at positions below the two semiconductor chips 1, filled vias 12 are disposed so as to correspond to each semiconductor chip. The structure other than the above is substantially the same as that of Embodiment 2.

As described above, in the case where a plurality of semiconductor chips are mounted close to each other, the position of a path for dissipating the heat self-generated by the chip is limited to one side of each chip, and such a path is ensured on both sides of each chip, whereby thermal interference between the adjacent semiconductor chips can be mitigated.

Embodiment 5

In a semiconductor device according to Embodiment 5, in the case where a plurality of semiconductor chips are mounted, tunnel structures of the Cu lid are completely spatially separated from each other, and a plurality of such structures are provided. In this case, when there are two semiconductor chips, having two tunnel structures is the same as in Embodiment 4, but the shape of the contact region between the Cu lid and the first-layer Cu wiring is different from that of Embodiment 4.

Specifically, in the form of Embodiment 4, electrodes are further prepared between relay pads for mounting the Cu lid.

Figure 13:
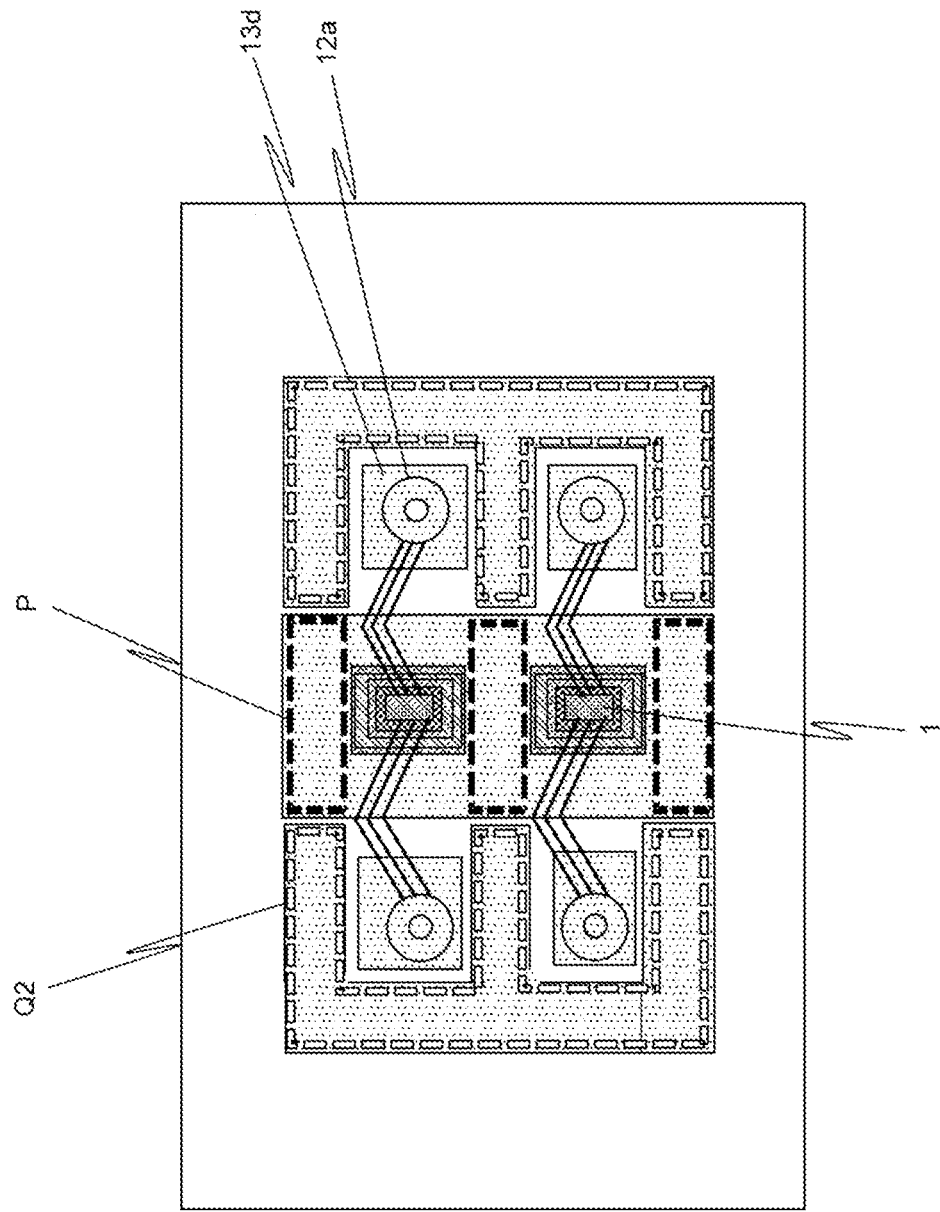
FIG. 13 is a plan view around a semiconductor chip related to a semiconductor device according to Embodiment 5.

FIG. 13 shows a plan view in this case. As shown in this drawing, each frame Q2 surrounded by a white broken line and showing the shape of the contact region between the Cu lid and the L1 layer in Embodiment 5 is characterized by being changed to an E-shape from the C-shape of the frame Q1 in Embodiment 4. Accordingly, a sealed structure, in which combined structures each obtained by combining each semiconductor chip, wires, and relay patterns as a unit are sealed so as to be separated from each other, is formed.

In Embodiment 5, the plurality of semiconductor chips, the input wires, and the output wires can be completely spatially separated from each other. That is, in addition to the effects of Embodiment 2, the electromagnetic fields generated from the plurality of semiconductor chips can be spatially separated from each other, so that characteristic fluctuations due to electromagnetic interference between the chips can be prevented.

Embodiment 6

In a semiconductor device according to Embodiment 6, while the structure of each semiconductor device in Embodiments 1 to 5 is maintained, only the material of the Cu lid is replaced with artificial diamond from Cu.

By replacing the material of the Cu lid with artificial diamond from Cu, the following effects are achieved. First, since artificial diamond can be electrically insulated from the top surface, there is no risk, such as when the Cu id is used, of ESD destruction (here, ESD is an abbreviation for Electro Static Discharge) of the chip due to an electrical surge or the like being applied from the lid top surface. In addition, in the case where artificial diamond is used, since the thermal conductivity of artificial diamond is about five times that of Cu, artificial diamond can contribute to further reduction in thermal resistance.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Specifically, for example, the cases of Cu and artificial diamond as the material of the lid have been described, but the present disclosure is not limited thereto, and the same effects can be expected even when Ag is used.

DESCRIPTION OF THE REFERENCE CHARACTERS 1 semiconductor chip
2 Au wire
2a input wire
2b output wire
3 sintered silver (Ag paste)
4 Cu lid
4a Cu lid exposed portion
4b Cu lid projection
5 SMD component
5a chip inductor
5b chip resistor
5c chip capacitor
6 printed board
7 mold resin
8 sub-mount
9 Cu core
10 ground electrode surface
11 resin layer
12 filled via
12a upper filled via
13, 13a, 13b, 13c peripheral pattern
13d relay pattern
14 first-layer Cu wiring pattern
15 fourth-layer Cu wiring pattern
16 roof portion

The invention claimed is:

1. A semiconductor device comprising:
a board;
a semiconductor chip disposed on a front surface of the board;
a conductive core embedded inside the board such that a front surface thereof is exposed on the front surface side of the board,
a lid joined to the exposed front surface of the conductive core of the board and covering the semiconductor chip; and
a mold resin formed on an entirety of the front surface of the board and provided so as to surround the lid such that a front surface of the lid is exposed, wherein
a height of a front surface of the mold resin is lower than a height of the front surface of the lid in a thickness direction of the board.

2. A semiconductor device comprising:
a board;
a semiconductor chip disposed on a front surface of the board;
a lid joined to the front surface of the board and covering the semiconductor chip;
a mold resin formed on an entirety of the front surface of the board and provided so as to surround the lid such that a front surface of the lid is exposed; and
a core embedded inside the board such that a front surface thereof is exposed on the front surface side of the board, wherein
a height of a front surface of the mold resin is lower than a height of the front surface of the lid in a thickness direction of the board,
the board has a ground electrode provided on a back surface thereof and includes a plurality of resin layers formed in a layered manner,
the semiconductor chip is disposed so as to face the front surface of the core and a filled via that is provided so as to penetrate a specific resin layer disposed between the core and the ground electrode, of the resin layers, and that electrically connects a back surface of the core and the ground electrode, and
the lid is joined by a joining material having a high thermal conductivity and including sintered silver on the front surface of the core.

3. The semiconductor device according to claim 2, further comprising:
a peripheral pattern disposed on the front surface of the board and around the semiconductor chip; and a wire disposed on the front surface of the board and connecting the semiconductor chip and the peripheral pattern, wherein the lid has a tunnel structure in which an open hole for routing the wire in a non-contact manner is formed.

4. The semiconductor device according to claim 3, wherein the peripheral pattern is a relay pattern directly below which an upper filled via for relaying the wire connected to the semiconductor chip, to a signal electrode is disposed, an entrance and exit of the tunnel structure of the lid are blocked, and an electric signal inputted and outputted through the wire can be taken out of the lid via the upper filled via from a second or higher layer from the front surface of the board.

5. The semiconductor device according to claim 3, wherein the board has a plurality of the semiconductor chips, the peripheral pattern has relay patterns each of which is disposed directly above an upper filled via for relaying the wire connected to the semiconductor chip, to a signal electrode and the number of which is proportional to the number of the semiconductor chips, and the lid has tunnel structures in each of which an open hole for routing the wire in a non-contact manner is formed and the number of which is equal to the number of the semiconductor chips.

6. The semiconductor device according to claim 5, wherein the lid has a sealed structure in which a plurality of combined structures each obtained by combining the semiconductor chip, the wire, and the relay pattern are sealed on the front surface of the board so as to be separated from each other.

7. The semiconductor device according to claim 1, wherein a material of the lid covering the semiconductor chip is artificial diamond.

8. The semiconductor device according to claim 2, wherein a material of the lid covering the semiconductor chip is artificial diamond.

9. The semiconductor device according to claim 3, wherein a material of the lid covering the semiconductor chip is artificial diamond.

10. The semiconductor device according to claim 4, wherein a material of the lid covering the semiconductor chip is artificial diamond.

11. The semiconductor device according to claim 5, wherein a material of the lid covering the semiconductor chip is artificial diamond.

12. The semiconductor device according to claim 6, wherein a material of the lid covering the semiconductor chip is artificial diamond.

13. The semiconductor device according to claim 1, wherein the lid is joined to the exposed front surface of the conductive core of the board by a joining material having a high thermal conductivity and including sintered silver.

* * * * *